United States Patent
Takahashi et al.

(10) Patent No.: US 9,993,878 B2
(45) Date of Patent: Jun. 12, 2018

(54) COATED CUTTING TOOL

(71) Applicant: TUNGALOY CORPORATION, Yoshima-Kogyodanchi, Iwaki-shi, Fukushima (JP)

(72) Inventors: Kinya Takahashi, Iwaki (JP); Hiroyuki Satoh, Iwaki (JP)

(73) Assignee: TUNGALOY CORPORATION, Iwaki-Shi, Fukushima (JP)

( * ) Notice: Subject to any disclaimer, the term of this patent is extended or adjusted under 35 U.S.C. 154(b) by 54 days.

(21) Appl. No.: 15/031,027

(22) PCT Filed: Nov. 7, 2014

(86) PCT No.: PCT/JP2014/079548
§ 371 (c)(1),
(2) Date: Apr. 21, 2016

(87) PCT Pub. No.: WO2015/068792
PCT Pub. Date: May 14, 2015

(65) Prior Publication Data
US 2016/0263659 A1    Sep. 15, 2016

(30) Foreign Application Priority Data
Nov. 8, 2013 (JP) .................. 2013-232520

(51) Int. Cl.
*B23B 27/14* (2006.01)
*C23C 16/40* (2006.01)
*C23C 16/56* (2006.01)
*C23C 16/06* (2006.01)
*C23C 16/44* (2006.01)
*C23C 14/06* (2006.01)
*C23C 28/04* (2006.01)

(52) U.S. Cl.
CPC ........ *B23B 27/148* (2013.01); *C23C 14/0664* (2013.01); *C23C 16/06* (2013.01); *C23C 16/403* (2013.01); *C23C 16/44* (2013.01); *C23C 16/56* (2013.01); *C23C 28/042* (2013.01); *C23C 28/044* (2013.01); *B23B 2222/16* (2013.01); *B23B 2222/28* (2013.01); *B23B 2224/04* (2013.01); *B23B 2224/32* (2013.01); *B23B 2226/125* (2013.01); *B23B 2226/18* (2013.01); *B23B 2228/04* (2013.01); *B23B 2228/105* (2013.01)

(58) Field of Classification Search
USPC .......... 51/307, 309; 428/216, 336, 698, 699, 428/701, 702, 704
See application file for complete search history.

(56) References Cited

U.S. PATENT DOCUMENTS

| | | | |
|---|---|---|---|
| 5,487,625 A * | 1/1996 | Ljungberg | ............ C23C 16/403 51/309 |
| 5,766,782 A * | 6/1998 | Ljungberg | .......... C23C 16/0272 51/307 |
| 5,766,786 A | 6/1998 | Ljungberg | |
| 5,851,687 A | 12/1998 | Ljungberg | |
| 2006/0219325 A1* | 10/2006 | Kohara | ............... C23C 14/0036 148/239 |
| 2008/0057280 A1* | 3/2008 | Watanabe | ............... C23C 16/36 428/698 |
| 2008/0292905 A1 | 11/2008 | Okada et al. | |
| 2009/0297835 A1 | 12/2009 | Okada et al. | |
| 2010/0330360 A1 | 12/2010 | Tanibuchi et al. | |
| 2011/0045283 A1* | 2/2011 | Holzschuh | ............. C23C 16/56 428/336 |
| 2013/0149527 A1 | 6/2013 | Cho et al. | |
| 2014/0193624 A1* | 7/2014 | Stiens | ................... C23C 30/005 428/216 |

FOREIGN PATENT DOCUMENTS

| | | | |
|---|---|---|---|
| DE | 102011053705 | * | 3/2013 |
| JP | H 05-116003 | | 5/1993 |
| JP | 06-246513 | * | 9/1994 |
| JP | 2002-370105 | | 12/2002 |
| JP | 2003-025114 | * | 1/2003 |
| JP | 2012-206223 A | | 10/2012 |
| RU | 2130823 C1 | | 5/1999 |
| RU | 2469819 C2 | | 12/2012 |
| WO | WO-2009/005924 A2 | | 1/2009 |
| WO | 2010047431 | * | 4/2010 |

OTHER PUBLICATIONS

Schalk et al., "Dry-Blasting of α- and $_K$-Al$_2$O$_3$ CVD Hard Coatings: Friction Behavior and Thermal Stress Relaxation," *Tribol Lett* (2013) 52:147-154.
Extended European Search Report dated Dec. 20, 2016 issued in European application (No. 14861085.0).
International Search Report dated Feb. 3, 2015 issued in counterpart International (PCT) Application (No. PCT/JP2014/079548).
Office Action issued in Russian Patent Application No. 2016122446/02(035123) dated Sep. 12, 2017.

* cited by examiner

*Primary Examiner* — Archene Turner
(74) *Attorney, Agent, or Firm* — Foley & Lardner LLP

(57) ABSTRACT

A coated cutting tool includes a substrate and a coating layer formed onto the surface of the substrate. The coating layer contains an α-type aluminum oxide layer. A residual stress value at the (116) plane of the α-type aluminum oxide layer is greater than 0. A residual stress value at the (012) plane of the α-type aluminum oxide layer is smaller than 0.

17 Claims, No Drawings

COATED CUTTING TOOL

RELATED APPLICATIONS

This is a 371 US National Phase of International Patent Application No. PCT/JP2014/079548 filed Nov. 7, 2014 and published as WO 2015/068792A1 on May 14, 2015, which claims priority to JP 2013-232520, filed Nov. 7, 2013. The contents of the aforementioned applications are incorporated by reference in their entirety.

TECHNICAL FIELD

The present invention relates to a coated cutting tool.

BACKGROUND ART

It has heretofore been known a coated cutting tool having a substrate comprising a cemented carbide and a coating layer formed on the surface of the substrate. The coating layer comprises, for example, at least one kind of compound selected from the group consisting of a carbide, a nitride, a carbonitride, a carboxide and a carboxynitride of Ti. The coating layer may contain aluminum oxide. The coating layer may be a single layer or may contain two or more layers. The coating layer is formed on the surface of the substrate by the chemical vapor deposition method. A whole thickness of the coating layer is 3 to 20 μm. The coated cutting tool having such a coating layer is used for cutting processing of a steel, cast iron, etc.

In general, a tensile stress remains in the film formed on the surface of the tungsten carbide-based cemented carbide. When the tensile stress is remained in the film, fracture strength of the coated cutting tool is lowered and the coated cutting tool is easily fractured.

As a technique to release the tensile stress remained in the film, it has been known a technique in which cracks are generated at the film by shot peening (for example, see Patent Document 1).

It has been known a coated cutting tool comprising a substrate and a film formed onto the substrate, wherein the film contains a TiCN film having a tensile stress and an α type $Al_2O_3$ film having a compression stress, and the TiCN film is located between the substrate and the α type $Al_2O_3$ film (for example, see Patent Document 2).

PRIOR ART DOCUMENT

Patent Documents

Patent Document 1: JP Hei.5-116003A
Patent Document 2: WO 2006/064724A

SUMMARY OF THE INVENTION

Problems to be Solved by the Invention

Cutting processing in recent years is remarkable in high-speed, high feeding and deep cutting, so that the tool life tends to be shortened than the conventional ones.

In the tool disclosed in the above-mentioned Patent Document 1, when a tensile stress remained in the film is released, fracture resistance of the tool is improved but there is a problem that wear resistance of the tool is lowered. The reason thereof is considered that a part of the film is peeled off from the crack generated at the film as a starting point.

The tool disclosed in the above-mentioned Patent Document 2 has a compression stress at the whole part of the α type $Al_2O_3$ film. Thus, the tool disclosed in the above-mentioned Patent Document 2 involves the problem that wear resistance is low.

The present invention has been done to solve these problems, and an object thereof is to improve wear resistance and fracture resistance of a coated cutting tool by controlling stress distribution of the coated cutting tool. In addition, an object of the present invention is to elongate the life of the tool.

Means to Solve the Problems

The present inventors have studied on the coated cutting tool from the above-mentioned viewpoints, and accomplished the following inventions. According to the present invention, wear resistance and fracture resistance of the tool can be improved. In addition, according to the present invention, a tool life can be elongated.

The summary of the present invention is as follows.

(1) A coated cutting tool which comprises a substrate and a coating layer formed on a surface of the substrate, wherein
the coating layer contains an α type aluminum oxide layer,
a residual stress value of the α type aluminum oxide layer at a (116) plane is larger than 0, and
a residual stress value of the α type aluminum oxide layer at a (012) plane is smaller than 0.

(2) The coated cutting tool of (1), wherein
the residual stress value of the α type aluminum oxide layer at the (116) plane is made A, then, A is 20≤A≤500 MPa, and
the residual stress value of the α type aluminum oxide layer at the (012) plane is made B, then, B is −800≤B≤−100 MPa.

(3) The coated cutting tool of (1) or (2), wherein the residual stress value is a value measured by a $sin^2 \psi$ method.

(4) The coated cutting tool of any one of (1) to (3), wherein an average thickness of the α type aluminum oxide layer is 1 to 15 μm.

(5) The coated cutting tool of any one of (1) to (4), wherein
the tool further comprises a Ti compound layer containing a compound of a Ti element and at least one element selected from the group consisting of C, N, O and B, and
the Ti compound layer is formed between the substrate and the α type aluminum oxide layer.

(6) The coated cutting tool of any one of (1) to (5), wherein
the Ti compound layer contains a TiCN layer, and
an atomic ratio of C based on a total of C and N [C/(C+N)] contained in the TiCN layer is 0.7≤C/(C+N)≤0.9.

(7) The coated cutting tool of any one of (1) to (6), wherein
an average thickness of the coating layer is 3 to 30 μm, and
an average thickness of the Ti compound layer is 2 to 15 μm.

(8) The coated cutting tool of any one of (1) to (7), wherein the substrate is a cemented carbide, cermet, ceramics or a cubic boron nitride sintered body.

<Coated Cutting Tool>

The coated cutting tool of the present invention comprises a substrate and a coating layer formed on the surface of the substrate. The coated cutting tool is, for example, an insert for milling, an insert for turning processing, a drill or an end mill, etc.

<Substrate>

The substrate of the present invention is, for example, a cemented carbide, a cermet, ceramics, a cubic boron nitride sintered body, a diamond sintered body or a high speed steel. Among these materials, a cemented carbide, a cermet, ceramics or a cubic boron nitride sintered body is preferred since wear resistance and fracture resistance are excellent.

Incidentally, the surface of the substrate may be modified. When the substrate is a cemented carbide, for example, a β-free layer may be formed on the surface of the substrate. When the substrate is a cermet, a hardened layer may be formed on the surface of the substrate.

<Coating Layer>

An average thickness of the coating layer of the present invention is preferably 3 to 30 μm. If the thickness of the coating layer is less than 3 μm, wear resistance of the coating layer is lowered in some cases. If the thickness of the coating layer exceeds 30 μm, adhesiveness between the coating layer and the substrate, and fracture resistance of the coating layer are lowered in some cases. The average thickness of the coating layer is further preferably 3 to 20 μm.

<α Type Aluminum Oxide Layer>

The coating layer of the present invention contains an aluminum oxide layer. The aluminum oxide layer may be one layer or a plural number of layers. A crystal form of the aluminum oxide layer is an α type.

The residual stress value at the (116) plane of the α type aluminum oxide layer of the present invention is larger than 0 (MPa). That is, the residual stress at the (116) plane of the α type aluminum oxide layer of the present invention is a tensile stress.

The residual stress value at the (012) plane of the α type aluminum oxide layer of the present invention is smaller than 0 (MPa). That is, the residual stress at the (012) plane of the α type aluminum oxide layer of the present invention is a compression stress.

When the residual stress at the (116) plane of the α type aluminum oxide layer is a tensile stress and the residual stress at the (012) plane of the α type aluminum oxide layer is also a tensile stress, cracks are likely generated at the coating layer at the time of cutting processing, and fracture resistance of the coated cutting tool is lowered.

When the residual stress at the (012) plane of the α type aluminum oxide layer is a compression stress and the residual stress at the (116) plane of the α type aluminum oxide layer is also a compression stress, an energy necessary for a mechanical processing such as dry shot-blasting, etc., to the coating layer becomes high. When the energy of the mechanical processing is high, cracks are likely generated at the coating layer. When the cracks are generated at the coating layer, a part of the coating layer is easily peeled off by the impact at the time of cutting processing. Therefore, inherent properties of the coating layer cannot sufficiently be exhibited, and wear resistance of the coated cutting tool is lowered.

The compression stress herein mentioned means a kind of an internal stress (inherent strain) of the coating layer, and is a stress exhibited by the numerical value of "−" (minus). The compression stress is large means that the absolute value of the compression stress is large. The compression stress is small means that an absolute value of the compression stress is small.

The tensile stress herein mentioned means a kind of an internal stress (inherent strain) of the coating layer, and is a stress exhibited by the numerical value of "+" (plus). In the present specification, when it is simply mentioned as a residual stress, it includes both of the compression stress and the tensile stress.

When the residual stress value at the (116) plane of the α type aluminum oxide layer of the present invention is made A, then, A is preferably 20≤A≤500 MPa. If the residual stress value A at the (116) plane of the α type aluminum oxide layer is less than 20 MPa, wear resistance of the coating layer tends to be lowered. If the residual stress value A at the (116) plane of the α type aluminum oxide layer exceeds 500 MPa, fracture resistance of the coating layer tends to be lowered.

When the residual stress value at the (012) plane of the α type aluminum oxide layer of the present invention is made B, then, B is preferably −800≤B≤−100 MPa. If the residual stress value B at the (012) plane of the α type aluminum oxide layer is less than −800 MPa, cracks or peeling is/are likely generated at the coating layer, and wear resistance of the coating layer is lowered. If the residual stress value B at the (012) plane of the α type aluminum oxide layer exceeds −100 MPa, an effect obtained by providing the compression stress to the coating layer becomes small, so that fracture resistance of the coating layer is lowered.

The residual stress values (A and B) can be measured by the $\sin^2\psi$ method using an X-ray stress measurement apparatus. Residual stress values at optional 10 points in the coating layer are measured by the $\sin^2\psi$ method, and it is preferred to obtain an average value of the residual stress values at these 10 points. The optional 10 points in the coating layer which are portions to be measured are preferably so selected that these points are separated 0.1 mm or more from each other.

For measuring the residual stress value at the (012) plane of the α type aluminum oxide layer, the (012) plane of the α type aluminum oxide layer is selected. Specifically, a sample on which the α type aluminum oxide layer has been formed is analyzed by an X-ray diffractometer. And change in the diffraction angle of the (012) plane when the angle ψ formed by the normal line of the sample plane and the normal line of the lattice plane has been changed is examined.

For measuring the residual stress value at the (116) plane of the α type aluminum oxide layer, the (116) plane of the α type aluminum oxide layer is selected. Specifically, a sample on which the α type aluminum oxide layer has been formed is analyzed by an X-ray diffractometer. And change in the diffraction angle of the (116) plane when the angle ψ formed by the normal line of the sample plane and the normal line of the lattice plane has been changed is examined.

An incident angle of the X ray is different depending on the face of the crystal of the α type aluminum oxide layer.

A residual stress value B measured by selecting the (012) plane of the α type aluminum oxide layer is considered to show the residual stress relatively at the surface side of the α type aluminum oxide layer.

A residual stress value A measured by selecting the (116) plane of the α type aluminum oxide layer is considered to show the residual stress relatively at the inside of the α type aluminum oxide layer.

An average thickness of the α type aluminum oxide layer of the present invention is preferably 1 to 15 μm. If the average thickness of the α type aluminum oxide layer is less than 1 μm, crater wear resistance of the rake face is lowered in some cases. If the average thickness of the α type aluminum oxide layer exceeds 15 μm, peeling is likely generated at the coating layer, and fracture resistance of the coating layer is lowered in some cases.

<Ti Compound Layer>

The coating layer of the present invention preferably contains a Ti compound layer. If the coating layer contains the Ti compound layer, wear resistance of the coating layer is improved. The Ti compound layer may be one layer or a plural number of layers.

The Ti compound layer of the present invention may be formed between the substrate and the α type aluminum oxide layer, or may be formed at the outside of the α type aluminum oxide layer.

The Ti compound layer of the present invention is preferably formed onto the surface of the substrate. When the Ti compound layer is formed onto the surface of the substrate, adhesiveness between the substrate and the coating layer is improved.

The Ti compound layer of the present invention may be formed at the outermost side of the coating layer. When the Ti compound layer is formed at the outermost side of the coating layer, the used corner of the coated cutting tool can be easily identified.

The Ti compound layer contains a Ti compound. The Ti compound contains Ti as an essential element, and contains at least one element selected from the group consisting of C, N, O and B. The Ti compound layer may further contain at least one element selected from the group consisting of Zr, Hf, V, Nb, Ta, Cr, Mo, W, Al and Si. The Ti compound layer contains, for example, at least one selected from the group consisting of a TiN layer, a TiCN layer, a TiC layer, a TiAlCNO layer, a TiAlCO layer, a TiCNO layer and a TiCO layer.

An average thickness of the Ti compound layer of the present invention is preferably 2 to 15 μm. If the average thickness of the Ti compound layer is less than 2 μm, wear resistance of the coating layer tends to be lowered. If the average thickness of the Ti compound layer exceeds 15 μm, fracture resistance of the coating layer tends to be lowered.

The Ti compound layer of the present invention preferably contains a TiCN layer. When the Ti compound layer contains a TiCN layer, wear resistance of the Ti compound layer is improved. An atomic ratio of C based on the total of C and N [C/(C+N)] contained in the TiCN layer is preferably $0.7 \leq C/(C+N) \leq 0.9$. If the C/(C+N) is less than 0.7, hardness of the coating layer is lowered whereby wear resistance of the coating layer is lowered in some cases. If the C/(C+N) exceeds 0.9, toughness of the coating layer is lowered whereby chipping resistance of the coating layer is lowered in some cases.

The atomic ratio of C based on the total of C and N [C/(C+N)] contained in the TiCN layer of the present invention can be measured, for example, by EPMA. Specifically, the amounts of C and N in the TiCN layer are quantified, respectively, by EPMA, whereby the C/(C+N) can be calculated.

[Forming Method of Coating Layer]

The respective layers constituting the coating layer of the coated cutting tool of the present invention can be formed, for example, by the following methods.

The TiN layer can be formed, for example, by the chemical vapor deposition method using the starting gas composition comprising $TiCl_4$: 1.0 to 5.0 mol %, $N_2$: 20 to 60 mol % and $H_2$: the remainder, at a temperature of 850 to 920° C. and a pressure of 100 to 350 hPa.

The TiCN layer can be formed, for example, by the chemical vapor deposition method using the starting gas composition comprising $TiCl_4$: 1.0 to 4.0 mol %, $C_3H_6$: 1.0 to 4.0 mol %, $N_2$: 10 to 50 mol % and $H_2$: the remainder, at a temperature of 700 to 900° C. and a pressure of 50 to 100 hPa. According to this procedure, a TiCN layer with C/(C+N)=0.7 to 0.9 can be formed.

The TiC layer can be formed by the chemical vapor deposition method using the starting gas composition comprising $TiCl_4$: 1.0 to 3.0 mol %, $CH_4$: 4.0 to 6.0 mol % and $H_2$: the remainder, at a temperature of 990 to 1030° C. and a pressure of 50 to 100 hPa.

The α type aluminum oxide ($Al_2O_3$) layer can be formed by the chemical vapor deposition method using the starting gas composition comprising $AlCl_3$: 1.0 to 5.0 mol %, $CO_2$: 2.5 to 4.0 mol %, HCl: 2.0 to 3.0 mol %, $H_2S$: 0.28 to 0.45 mol % and $H_2$: the remainder, at a temperature of 900 to 1000° C. and a pressure of 60 to 80 hPa.

The TiAlCNO layer can be formed by the chemical vapor deposition method using the starting gas composition comprising $TiCl_4$: 1.0 to 5.0 mol %, $AlCl_3$: 1.0 to 2.0 mol %, CO: 0.4 to 1.0 mol %, $N_2$: 30 to 40 mol % and $H_2$: the remainder, at a temperature of 975 to 1025° C. and a pressure of 90 to 110 hPa.

The TiAlCO layer can be formed by the chemical vapor deposition method using the starting gas composition comprising $TiCl_4$: 0.5 to 1.5 mol %, $AlCl_3$: 1.0 to 5.0 mol %, CO: 2.0 to 4.0 mol % and $H_2$: the remainder, at a temperature of 975 to 1025° C. and a pressure of 60 to 100 hPa.

The TiCNO layer can be formed by the chemical vapor deposition method using the starting gas composition comprising $TiCl_4$: 1.0 to 5.0 mol %, CO: 0.4 to 1.0 mol %, $N_2$: 30 to 40 mol % and $H_2$: the remainder, at a temperature of 975 to 1025° C. and a pressure of 90 to 110 hPa.

The TiCO layer can be formed by the chemical vapor deposition method using the starting gas composition comprising $TiCl_4$: 0.5 to 3.0 mol %, CO: 2.0 to 4.0 mol % and $H_2$: the remainder, at a temperature of 975 to 1025° C. and a pressure of 60 to 100 hPa.

The coated cutting tool in which the residual stresses of the coating layer have been controlled can be obtained, for example, by the following methods.

After forming the coating layer onto the substrate, projection materials are projected to the surface of the coating layer by using dry shot-blasting or shot peening. A projection angle of the projection materials is preferably 2 to 10°. The projection materials are preferably cubic boron nitride (cBN). When the dry shot-blasting or the shot peening treatment is applied to the rake face, the flank face is preferably subjected to masking so that the projection materials do not hit the same. To the contrary, when the dry shot-blasting or the shot peening treatment is applied to the flank face, the rake face is preferably subjected to masking. An average particle diameter of the projection materials is preferably 100 to 150 μm. A projection speed of the projection materials is preferably 85 to 150 m/sec.

Thicknesses of the respective layers contained in the coating layer can be measured, for example, by using an optical microscope, a scanning electron microscope (SEM) or a field emission type scanning electron microscope (FE-SEM). Specifically, the cross-sectional structure of the coated cutting tool is observed by using an optical microscope, a scanning electron microscope (SEM) or a field emission type scanning electron microscope (FE-SEM). Incidentally, the thicknesses of the respective layers contained in the coating layer are preferably measured at the position near to 50 μm toward the rake face from the cutting edge. The thicknesses of the respective layers contained in the coating layer are preferably measured at three or more portions, and an average value of the thicknesses at the measured three portions.

Compositions of the respective layers contained in the coating layer can be measured by using an energy dispersive X-ray spectrometer (EDS), a wavelength dispersive X-ray spectrometer (WDS) or an electron probe microanalyzer (EPMA). For example, the compositions of the respective layers can be measured by analyzing the cross-sectional structure of the coated cutting tool using these apparatuses.

The composition of the TiCN layer can be measured by using an energy dispersive X-ray spectrometer (EDS), a wavelength dispersive X-ray spectrometer (WDS) or an electron probe microanalyzer (EPMA). For example, the composition of the TiCN layer can be measured by analyzing the cross-sectional structure of the coated cutting tool using these apparatuses.

Effects of the Invention

The coated cutting tool of the present invention has high wear resistance and excellent fracture resistance. Accordingly, the coated cutting tool of the present invention has a longer life than those of the conventional tools.

EXAMPLES

In the following, the present invention is explained by referring to Examples, but the present invention is not limited by these.

According to the procedure mentioned below, a coated cutting tool (a sample) having a substrate and a coating layer formed onto the surface of the substrate was prepared. A sectional surface of the sample was observed by SEM at the neighbor of 50 μm from the cutting edge of the prepared sample toward the center portion of the rake face of the prepared sample. A thickness of the coating layer of the coated cutting tool (the sample) was measured at the three portions, and an average value of the thickness of the measured three portions was obtained.

The residual stress of the α type aluminum oxide layer contained in the coating layer was measured by the $\sin^2\psi$ method using an X-ray stress measurement apparatus. The residual stress of the α type aluminum oxide layer was measured at the optional ten points in the coating layer, and an average value of the measured residual stresses was obtained.

A cutting insert made of a cemented carbide having a JIS standard CNMA120408 shape with a composition of 93.6WC-6.0Co-0.4$Cr_3C_2$ (% by mass) was used as the substrate. After round honing was applied to the cutting blade ridge line portion of the substrate by a SiC brush, the surface of the substrate was washed.

After washing the surface of the substrate, the substrate was conveyed to an external heating type chemical vapor deposition apparatus. At the inside of an external heating type chemical vapor deposition apparatus, a coating layer was formed onto the surface of the substrate. The formation conditions of the coating layer are shown in Table 1. The constitution and the average thickness of the coating layer are shown in Table 2.

TABLE 1

| Kind of coating layer | Temperature (° C.) | Pressure (hPa) | Composition of starting materials (mol %) |
|---|---|---|---|
| α type $Al_2O_3$ | 1000 | 70 | $AlCl_3$: 2.7%, $CO_2$: 3.3%, HCl: 2.5%, $H_2S$: 0.3%, $H_2$: 91.2% |
| TiN | 900 | 400 | $TiCl_4$: 3.2%, $N_2$: 40%, $H_2$: 56.8% |
| TiC | 1000 | 75 | $TiCl_4$: 2.4%, $CH_4$: 4.6%, $H_2$: 93% |
| TiCN [C/(C + N): 0.6] | 800 | 75 | $TiCl_4$: 3.0%, $CH_3CN$: 0.3%, $H_2$: 96.7% |
| TiCN [C/(C + N): 0.7] | 800 | 75 | $TiCl_4$: 2.5%, $C_3H_6$: 1.0%, $N_2$: 20%, $H_2$: 76.5% |
| TiCN [C/(C + N): 0.8] | 800 | 75 | $TiCl_4$: 2.5%, $C_3H_6$: 2.5%, $N_2$: 20%, $H_2$: 75% |
| TiCN [C/(C + N): 0.9] | 800 | 75 | $TiCl_4$: 2.5%, $C_3H_6$: 4.0%, $N_2$: 10%, $H_2$: 83.5% |
| TiCN [C/(C + N): 0.95] | 800 | 75 | $TiCl_4$: 2.5%, $C_3H_6$: 6.0%, $N_2$: 5%, $H_2$: 86.5% |
| TiCNO | 1000 | 100 | $TiCl_4$: 3.5%, CO: 0.7%, $N_2$: 35.5%, $H_2$: 60.3% |
| TiAlCNO | 1000 | 100 | $TiCl_4$: 3.8%, $AlCl_3$: 1.5%, CO: 0.7%, $N_2$: 35.2%, $H_2$: 58.8% |
| TiCO | 1000 | 80 | $TiCl_4$: 1.3%, CO: 2.7%, $H_2$: 96% |
| TiAlCO | 1000 | 80 | $TiCl_4$: 1.1%, $AlCl_3$: 3.9%, CO: 2.8%, $H_2$: 92.2% |

TABLE 2

| | Coating layer | | | | | | | |
|---|---|---|---|---|---|---|---|---|
| | Ti compound layer | | | | | | α type $Al_2O_3$ layer | Average thickness of whole coating layer (μm) |
| | First layer | | Second layer | | Third layer | | | |
| Sample No. | Composition | Average thickness (μm) | Composition | Average thickness (μm) | Composition | Average thickness (μm) | Average thickness (μm) | |
| Present product1 | TiN | 0.3 | TiCN | 8 | TiCNO | 0.5 | 8 | 16.8 |
| Present product2 | TiN | 0.3 | TiCN | 2 | TiCNO | 0.5 | 2 | 4.8 |
| Present product3 | TiN | 0.3 | TiCN | 13 | TiCNO | 0.5 | 13 | 26.8 |
| Present product4 | TiC | 0.3 | TiCN | 8 | TiCNO | 0.5 | 8 | 16.8 |

TABLE 2-continued

| | Coating layer | | | | | | | |
|---|---|---|---|---|---|---|---|---|
| | Ti compound layer | | | | | | α type Al₂O₃ layer | Average thickness of whole coating layer (μm) |
| | First layer | | Second layer | | Third layer | | | |
| Sample No. | Composition | Average thickness (μm) | Composition | Average thickness (μm) | Composition | Average thickness (μm) | Average thickness (μm) | |
| Present product5 | TiN | 0.3 | TiCN | 8 | TiCNO | 0.5 | 8 | 16.8 |
| Present product6 | TiN | 0.3 | TiCN | 8 | TiCNO | 0.5 | 8 | 16.8 |
| Present product7 | TiN | 0.3 | TiCN | 8 | TiCNO | 0.5 | 8 | 16.8 |
| Present product8 | TiN | 0.3 | TiCN | 8 | TiCNO | 0.5 | 8 | 16.8 |
| Present product9 | TiN | 0.3 | TiCN | 8 | TiCNO | 0.5 | 8 | 16.8 |
| Present product10 | TiN | 0.3 | TiCN | 8 | TiCNO | 0.5 | 8 | 16.8 |
| Present product11 | TiN | 0.3 | TiCN | 8 | TiAlCNO | 0.5 | 8 | 16.8 |
| Present product12 | TiN | 0.3 | TiCN | 8 | TiCNO | 0.5 | 8 | 16.8 |
| Present product13 | TiC | 0.3 | TiCN | 8 | TiCO | 0.5 | 8 | 16.8 |
| Present product14 | TiN | 0.3 | TiCN | 8 | TiAlCO | 0.5 | 8 | 16.8 |
| Comparative product1 | TiN | 0.2 | TiCN | 1 | TiCNO | 0.3 | 1 | 2.5 |
| Comparative product2 | TiN | 0.5 | TiCN | 15 | TiCNO | 0.5 | 17 | 33.0 |
| Comparative product3 | TiN | 0.3 | TiCN | 8 | TiCNO | 0.5 | 8 | 16.8 |
| Comparative product4 | TiN | 0.3 | TiCN | 8 | TiCNO | 0.5 | 8 | 16.8 |
| Comparative product5 | TiN | 0.3 | TiCN | 8 | TiCNO | 0.5 | 8 | 16.8 |
| Comparative product6 | TiN | 0.3 | TiCN | 8 | TiCNO | 0.5 | 8 | 16.8 |
| Comparative product7 | TiN | 0.3 | TiCN | 8 | TiCNO | 0.5 | 8 | 16.8 |
| Comparative product8 | TiN | 0.3 | TiCN | 8 | TiCNO | 0.5 | 8 | 16.8 |
| Comparative product9 | TiN | 0.3 | TiCN | 8 | TiCNO | 0.5 | 8 | 16.8 |
| Comparative product10 | TiN | 0.3 | TiCN | 8 | TiCNO | 0.5 | 8 | 16.8 |

With regard to Present products 1 to 14, after forming the coating layer, the dry shot-blasting was applied to the rake face and the flank face, respectively, under the conditions shown in Table 3. At this time, when the rake face was to be processed, the flank face was masked so that the projection materials did not hit thereto. When the flank face was to be processed, the rake face was masked.

With regard to Comparative products 1 to 9, after forming the coating layer, the dry shot-blasting or the wet shot-blasting was applied under the conditions shown in Table 4. With regard to Comparative product 10, neither the dry shot-blasting nor the wet shot-blasting was applied.

TABLE 3

| Sample No. | Shot-blasting | Projection materials | Average particle size of projection materials (μm) | Projection speed (m/sec) | Projection angle (°) |
|---|---|---|---|---|---|
| Present product 1 | Dry | cBN | 120 | 120 | 10 |
| Present product 2 | Dry | cBN | 100 | 120 | 5 |
| Present product 3 | Dry | cBN | 120 | 120 | 10 |
| Present product 4 | Dry | cBN | 120 | 120 | 10 |
| Present product 5 | Dry | cBN | 120 | 120 | 10 |
| Present product 6 | Dry | cBN | 120 | 120 | 10 |
| Present product 7 | Dry | cBN | 120 | 120 | 10 |
| Present product 8 | Dry | cBN | 120 | 120 | 10 |
| Present product 9 | Dry | cBN | 120 | 150 | 10 |

TABLE 3-continued

| Sample No. | Shot-blasting | Projection materials | Average particle size of projection materials (μm) | Projection speed (m/sec) | Projection angle (°) |
|---|---|---|---|---|---|
| Present product 10 | Dry | cBN | 120 | 100 | 10 |
| Present product 11 | Dry | cBN | 120 | 120 | 10 |
| Present product 12 | Dry | cBN | 120 | 120 | 10 |
| Present product 13 | Dry | cBN | 120 | 120 | 10 |
| Present product 14 | Dry | cBN | 120 | 120 | 10 |

TABLE 4

| Sample No. | Shot-blasting | Projection materials | Average particle size of projection materials (μm) | Projection speed (m/sec) | Projection angle (°) |
|---|---|---|---|---|---|
| Comparative product 1 | Dry | cBN | 120 | 120 | 60 |
| Comparative product 2 | Wet | Al$_2$O$_3$ | 30 | 100 | 45 |
| Comparative product 3 | Wet | Al$_2$O$_3$ | 30 | 100 | 45 |
| Comparative product 4 | Wet | Al$_2$O$_3$ | 30 | 100 | 45 |
| Comparative product 5 | Dry | Al$_2$O$_3$ | 120 | 120 | 45 |
| Comparative product 6 | Dry | Al$_2$O$_3$ | 120 | 120 | 45 |
| Comparative product 7 | Wet | Al$_2$O$_3$ | 30 | 100 | 45 |
| Comparative product 8 | Dry | Al$_2$O$_3$ | 120 | 120 | 45 |
| Comparative product 9 | Dry | Al$_2$O$_3$ | 120 | 120 | 60 |
| Comparative product 10 | | No treatment | | | |

The residual stress of the α type aluminum oxide layer was measured by the sin$^2$ψ method using an X-ray stress measurement apparatus. The measured results of the residual stress of the α type aluminum oxide layer are shown in Table 5.

TABLE 5

| | α type aluminum oxide layer | |
|---|---|---|
| Sample No. | Residual stress value A (MPa) at (116) plane (MPa) | Residual stress value B (MPa) at (012) plane (MPa) |
| Present product 1 | 200 | −400 |
| Present product 2 | 50 | −300 |
| Present product 3 | 200 | −400 |
| Present product 4 | 200 | −400 |
| Present product 5 | 200 | −400 |
| Present product 6 | 200 | −400 |
| Present product 7 | 200 | −400 |
| Present product 8 | 200 | −400 |
| Present product 9 | 50 | −700 |
| Present product 10 | 400 | −200 |
| Present product 11 | 200 | −400 |
| Present product 12 | 200 | −400 |
| Present product 13 | 250 | −320 |
| Present product 14 | 190 | −360 |
| Comparative product 1 | −30 | −200 |
| Comparative product 2 | 400 | 100 |
| Comparative product 3 | 400 | 100 |
| Comparative product 4 | 400 | 100 |
| Comparative product 5 | −200 | −300 |
| Comparative product 6 | −200 | −300 |
| Comparative product 7 | 550 | 200 |
| Comparative product 8 | −200 | −1000 |
| Comparative product 9 | −100 | −900 |
| Comparative product 10 | 730 | 620 |

An atomic ratio of C based on the total of C and N [C/(C+N)] contained in the TiCN layer was measured by using EPMA. Specifically, an atomic ratio at the position of 50 μm from the cutting edge of the coated cutting tool toward the center portion of the rake face was measured by EPMA.

TABLE 6

| Sample No. | TiCN C/(C + N) |
|---|---|
| Present product 1 | 0.8 |
| Present product 2 | 0.8 |
| Present product 3 | 0.8 |
| Present product 4 | 0.8 |
| Present product 5 | 0.7 |
| Present product 6 | 0.9 |
| Present product 7 | 0.8 |
| Present product 8 | 0.8 |
| Present product 9 | 0.8 |
| Present product 10 | 0.8 |
| Present product 11 | 0.8 |
| Present product 12 | 0.8 |
| Present product 13 | 0.75 |
| Present product 14 | 0.6 |
| Comparative product 1 | 0.8 |
| Comparative product 2 | 0.8 |
| Comparative product 3 | 0.6 |
| Comparative product 4 | 0.95 |
| Comparative product 5 | 0.8 |
| Comparative product 6 | 0.8 |
| Comparative product 7 | 0.8 |
| Comparative product 8 | 0.8 |
| Comparative product 9 | 0.8 |
| Comparative product 10 | 0.8 |

By using the obtained samples (tools), Cutting test 1 and Cutting test 2 were carried out. Cutting test 1 is a test to evaluate wear resistance of the tool. Cutting test 2 is a test to evaluate fracture resistance of the tool.

[Cutting Test 1]

Work piece material: FCD600

Shape of work piece material: Disc having φ180 mm×L20 mm (a square hole with φ75 mm at the center of the disc)

Cutting speed: 150 m/min

Feed: 0.35 mm/rev

Depth of cut: 2.0 mm

Coolant: Used

In Cutting test 1, the work piece material was cut using the sample to measure the life of the sample (tool). Specifically, the processing time until a maximum wear width of the flank face of the sample reached 0.3 mm was measured.

[Cutting Test 2]
Work piece material: FC200
Shape of work piece material: Disc having φ180 mm×L20 mm with two grooves having a width of 15 mm (a hole with φ65 mm at the center of the disc)
Cutting speed: 400 m/min
Feed: 0.35 mm/rev
Depth of cut: 2.0 mm
Coolant: Used In Cutting test 2, the work piece material was cut using the sample to measure the life of the sample (tool). Specifically, the number of impacts until the sample was fractured or the maximum wear width of the flank face of the sample reached 0.3 mm was measured. The number of impacts means a number of times in which the sample and the work piece material have been contacted. When the number of impacts reached 20,000 times, the test was finished. Five specimens were prepared for each sample. With regard to each sample, the number of impacts was measured five times. An average value of the number of impacts which had been measured five times was calculated.

TABLE 7

| Sample No. | Cutting test 1 Wear test | | Cutting test 2 Fracture test | |
|---|---|---|---|---|
| | Tool life (min) | Damaged state | Tool life (times) | Damaged state |
| Present product 1 | 45 | Normal wear | 18000 | Fractured |
| Present product 2 | 35 | Normal wear | 20000 | Normal wear |
| Present product 3 | 55 | Normal wear | 16000 | Fractured |
| Present product 4 | 45 | Normal wear | 18000 | Fractured |
| Present product 5 | 40 | Normal wear | 19000 | Fractured |
| Present product 6 | 50 | Normal wear | 17000 | Fractured |
| Present product 7 | 45 | Normal wear | 17000 | Fractured |
| Present product 8 | 45 | Normal wear | 18000 | Fractured |
| Present product 9 | 40 | Normal wear | 19500 | Fractured |
| Present product 10 | 45 | Normal wear | 17000 | Fractured |
| Present product 11 | 45 | Normal wear | 18000 | Fractured |
| Present product 12 | 45 | Normal wear | 18000 | Fractured |
| Present product 13 | 38 | Normal wear | 17000 | Fractured |
| Present product 14 | 35 | Normal wear | 16500 | Fractured |
| Comparative product 1 | 10 | Normal wear | 18000 | Fractured |
| Comparative product 2 | 20 | Fractured | 3000 | Fractured |
| Comparative product 3 | 15 | Normal wear | 12000 | Fractured |
| Comparative product 4 | 25 | Chipping | 8000 | Fractured |
| Comparative product 5 | 20 | Peeling of coating film | 7000 | Fractured |
| Comparative product 6 | 30 | Normal wear | 11000 | Fractured |
| Comparative product 7 | 45 | Normal wear | 5000 | Fractured |
| Comparative product 8 | 20 | Normal wear | 18000 | Fractured |
| Comparative product 9 | 25 | Normal wear | 17000 | Fractured |
| Comparative product 10 | 35 | Fractured | 1500 | Fractured |

As shown in Table 7, wear resistance and fracture resistance of Present products are improved. Present products had longer processing times until these reached the tool life and had much number of impacts than those of Comparative products. From these results, it can be understood that the tool lives of Present products are markedly longer than those of Comparative products.

UTILIZABILITY IN INDUSTRY

The coated cutting tool of the present invention has high wear resistance and excellent fracture resistance. The coated cutting tool of the present invention has longer life than those of the conventional tools, so that it has high utilizability in industry.

The invention claimed is:
1. A coated cutting tool which comprises a substrate and a coating layer formed on a surface of the substrate, wherein the coating layer contains an α-type aluminum oxide layer, a residual stress value of the α-type aluminum oxide layer at a (116) plane is greater than 0, and a residual stress value of the α-type aluminum oxide layer at a (012) plane is smaller than 0.

2. The coated cutting tool according to claim 1, wherein if the residual stress value of the α-type aluminum oxide layer at the (116) plane is given by A, then A is 20≤A≤500 MPa, and if the residual stress value of the α-type aluminum oxide layer at the (012) plane is given by B, then B is −800≤B≤−100 MPa.

3. The coated cutting tool according to claim 1, wherein the residual stress value is a value measured by a $\sin^2 \psi$ method.

4. The coated cutting tool according to claim 1, wherein an average thickness of the α-type aluminum oxide layer is 1 to 15 μm.

5. The coated cutting tool according to claim 1, wherein the tool further comprises a Ti compound layer containing a compound of a Ti element and at least one element selected from the group consisting of C, N, O and B, and the Ti compound layer is formed between the substrate and the α-type aluminum oxide layer.

6. The coated cutting tool according to claim 5, wherein the Ti compound layer contains a TiCN layer, and an atomic ratio of C based on a total of C and N [C/(C+N)] contained in the TiCN layer is 0.7≤C/(C+N)≤0.9.

7. The coated cutting tool according to claim 5, wherein an average thickness of the coating layer is 3 to 30 μm, and an average thickness of the Ti compound layer is 2 to 15 μm.

8. The coated cutting tool according to claim 1, wherein the substrate is a cemented carbide, cermet, ceramics or a cubic boron nitride sintered body.

9. The coated cutting tool according to claim 1, wherein if the residual stress value of the α-type aluminum oxide layer at the (116) plane is given by A, then A is 20≤A≤500 MPa; if the residual stress value of the α-type aluminum oxide layer at the (012) plane is given by B, then B is −800≤B≤−100 MPa; and the residual stress value is a value measured by a $\sin^2 \psi$ method.

10. The coated cutting tool according to claim 1, wherein an average thickness of the α-type aluminum oxide layer is 1 to 15 μm; the tool further comprises a Ti compound layer containing a compound of a Ti element and at least one element selected from the group consisting of C, N, O and B, and the Ti compound layer is formed between the substrate and the α-type aluminum oxide layer.

11. The coated cutting tool according to claim 10, wherein the Ti compound layer contains a TiCN layer, and an atomic ratio of C based on a total of C and N [C/(C+N)] contained in the TiCN layer is 0.7≤C/(C+N)≤0.9.

12. The coated cutting tool according to claim 11, wherein an average thickness of the coating layer is 3 to 30 μm, and an average thickness of the Ti compound layer is 2 to 15 μm.

13. The coated cutting tool according to claim 12, wherein the substrate is a cemented carbide, cermet, ceramics or a cubic boron nitride sintered body.

14. The coated cutting tool according to claim 1, wherein an average thickness of the coating layer is 3 to 30 μm; an average thickness of the α-type aluminum oxide layer is 1 to 15 μm; the tool comprises a Ti compound layer formed between the substrate and the α-type aluminum oxide layer; the Ti compound layer contains a TiCN layer; and an atomic ratio of C based on a total of C and N [C/(C+N)] contained in the TiCN layer is 0.7≤C/(C+N)≤0.9.

15. The coated cutting tool according to claim 14, wherein if the residual stress value of the α-type aluminum oxide layer at the (116) plane is given by A, then A is 20≤A≤500 MPa, and if the residual stress value of the α-type aluminum oxide layer at the (012) plane is given by B, then B is −800≤B≤−100 MPa.

16. The coated cutting tool according to claim 15, wherein the substrate is a cemented carbide, cermet, ceramics or a cubic boron nitride sintered body.

17. The coated cutting tool according to claim 14, wherein the substrate is a cemented carbide, cermet, ceramics or a cubic boron nitride sintered body.

\* \* \* \* \*